Jan. 9, 1962 R. W. HELDA ET AL 3,015,881

COMPONENT INSERTING APPARATUS

Filed May 15, 1959 3 Sheets-Sheet 1

INVENTORS
ROBERT W. HELDA
WILLIAM L. LEHNER
NELSON LEE WALKER

BY Robert E. Strauss
ATTORNEY

COMPONENT INSERTING APPARATUS

Filed May 15, 1959 3 Sheets-Sheet 2

INVENTOR
ROBERT W. HELDA
WILLIAM L. LEHNER
NELSON LEE WALKER
BY Robert E. Strausser
ATTORNEY Jan. 9, 1962 R. W. HELDA ET AL 3,015,881

COMPONENT INSERTING APPARATUS

Filed May 15, 1959 3 Sheets-Sheet 3

INVENTORS
ROBERT W. HELDA
WILLIAM L. LEHNER
NELSON LEE WALKER
BY Robert E. Strausser
ATTORNEY 3,015,881
COMPONENT INSERTING APPARATUS
Robert W. Helda, Williamsville, William L. Lehner, Snyder, and Nelson Lee Walker, Batavia, N.Y., assignors to Sylvania Electric Products Inc., a corporation of Delaware
Filed May 15, 1959, Ser. No. 813,546
5 Claims. (Cl. 29—203)

This invention relates to apparatus for inserting electrical components into a chassis and more particularly for inserting components of the leadless type into a printed circuit board.

Many advances in the electronics industry have been directed toward the mechanization of assembly operations performed in the production of electronic equipment. These advances have included adoption of the printed circuit board chassis, fabrication of components uniquely designed for use with such chassis, and specific component assembly apparatus compatable with the particular physical characteristics of the components and chassis. As new components are developed for use in mass-produced complex electronic devices, assembly apparatus must also be developed to overcome the problems incident to their use. One of the important component developments which has occurred is that of wire leadless components. In developing a leadless component, the problem of lead forming and alignment previously encountered in the automated manufacture of devices utilizing printed circuit boards has been obviated. However, the introduction of these components brought additional problems in that new means had to be provided for segregating a component to be inserted into the panel from a mass of components, aligning it in the proper position, and inserting it into the chassis. Therefore, it is an object of this invention to segregate, align and insert leadless components into a printed circuit board.

In all manufacturing operations, the space required by the machinery employed in the operation is of economic importance. This is particularly true in the automatic assembly of components upon printed circuit boards since each component is individually inserted. When a large number of components are to be inserted, a large number of assembly machines must be provided. In an ideal situation all of the machines are aligned adjacent a printed circuit panel conveyor and are spaced from one another only by a minimal separation. This ideal had been extremely difficult to achieve with prior component insertion apparatus and the problem is aggravated where the chassis configuration requires that the component be inserted into the board at an angle less than 90 degrees to the longitudinal axis of the board. In this situation, previous apparatus required additional space since the supply means and the inserting head were not adjustable with respect to one another but had to be positioned as a unit. Therefore, it is another object of this invention to position the head of an insertion apparatus with respect to the workpiece independent of the relative position of the component supply means.

Many of the component inserters which had been utilized were extremely complex, costly, and had a low insertion rate. Therefore, another object of this invention is to provide a simple, low cost insertion machine which is capable of a sustained high insertion rate.

The foregoing objects are achieved in one aspect of the invention by the provision of an apparatus for inserting components of the leadless type into an apertured electrical chassis comprising the combination of an oscillatable hopper for the components, means for oscillating the hopper in a curvilinear path, a component inserting head, means for conveying the components from the hopper to the inserting head, and means for operating the inserting head whereby one of the components is inserted into an aperture in the chassis.

For a better understanding of the invention, reference is made to the following description taken in conjunction with the accompanying drawings in which.

Figure 1:
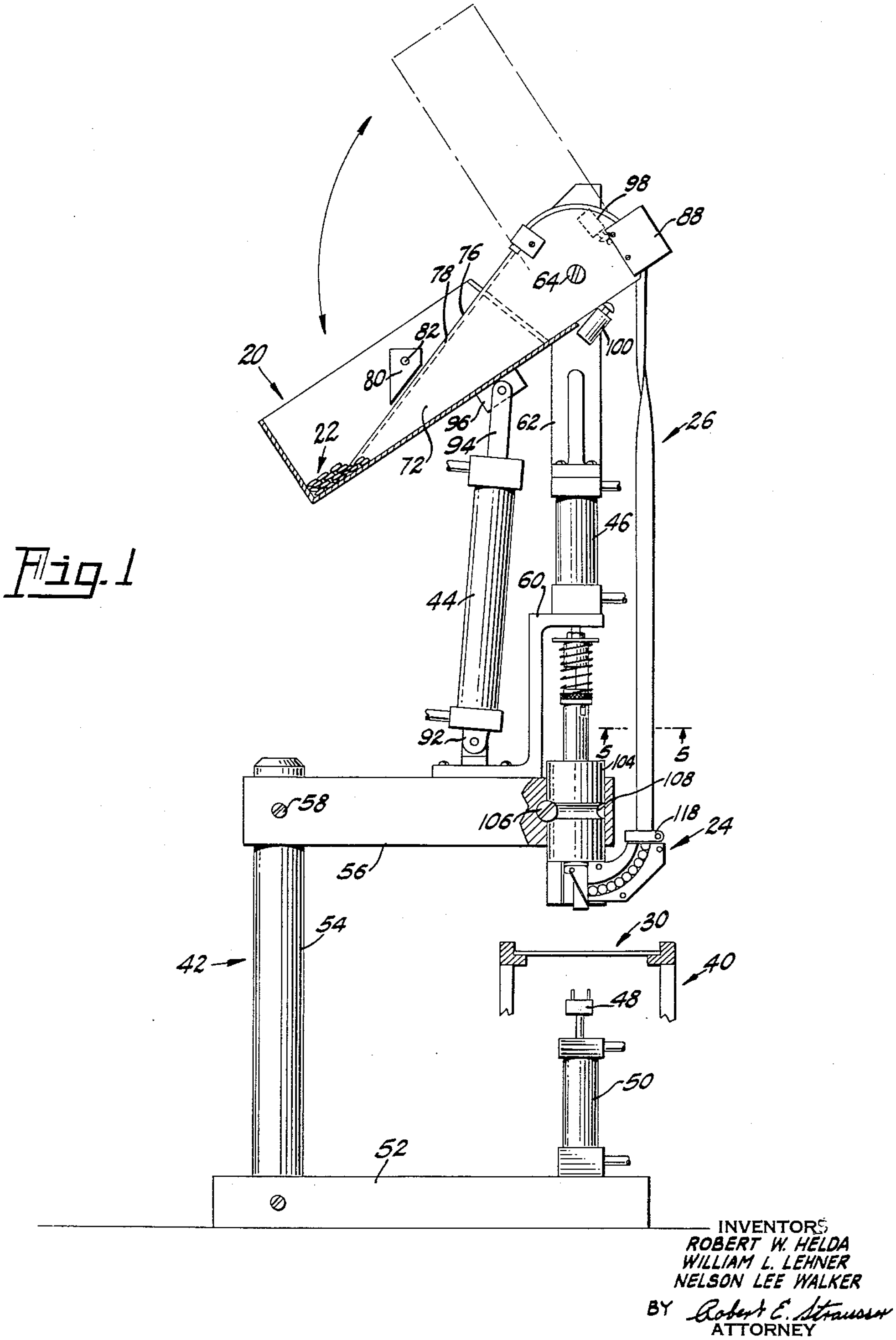
FIG. 1 is a side elevation view of one embodiment of the invention with some parts omitted and some parts broken away in the interest of simplicity and clarity.
Figure 3:
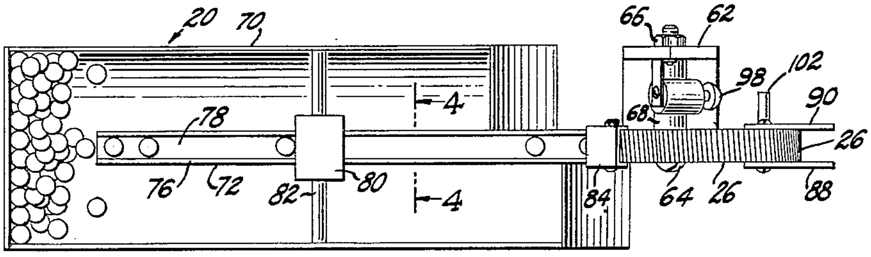
FIG. 3 is a plan view of the oscillatable hopper.
Figure 4:
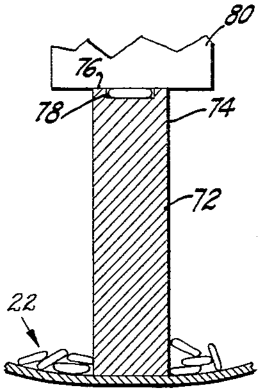
FIG. 4 is an elevational cross section of the vertical center board of the hopper.
Figure 2:
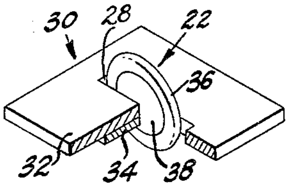
FIG. 2 is a perspective view of a leadless component inserted into an apertured electrical chassis.
Figure 12:
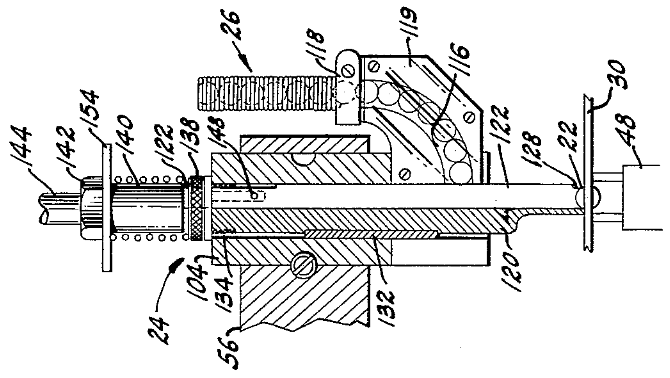
FIG. 12 is also a view similar to FIG. 7 showing the component inserting head in the inserting position with the component inserted.
Figure 11:
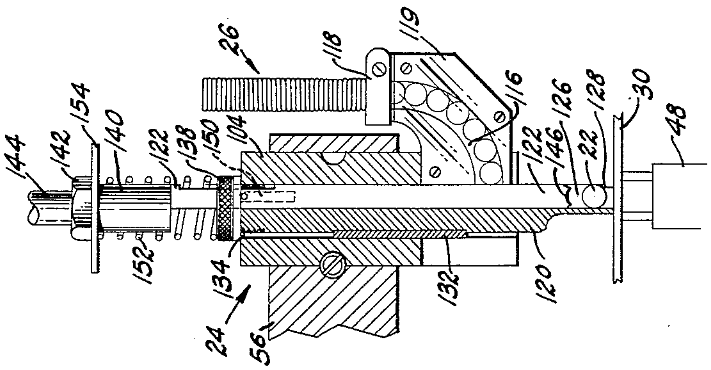
FIG. 11 is a view of the inserting head similar to FIG. 7 showing the component inserting head in the inserting position prior to the component insertion.
Figure 7:
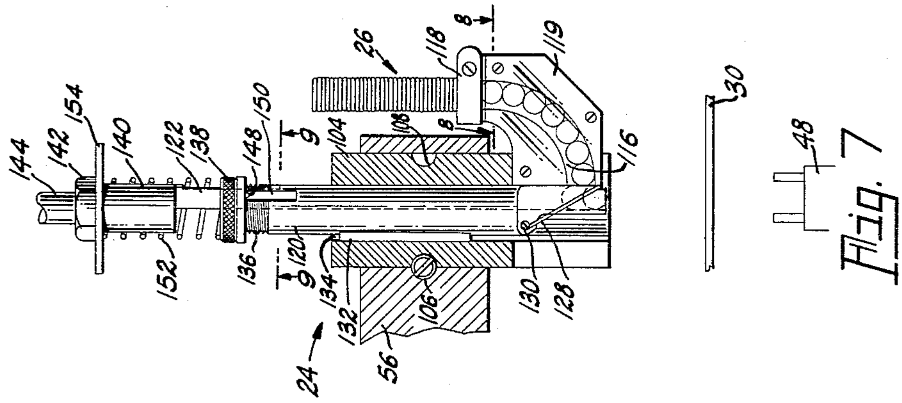
FIG. 7 is a fragmentary cross-sectional elevation of the component inserting head in the loading position.

Referring to FIGS. 1 and 2, the apparatus is provided with a hopper 20 which is oscillated in the vertical plane parallel to the surface of the drawing about a horizontal axis perpendicular thereto. Each oscillation of hopper 20 delivers some of the components 22 to the inserting head 24 through a flexible chute 26. The component is then inserted into an aperture 28 formed in a printed circuit board or chassis 30 positioned beneath the head. The printed circuit board 30 may be of the type comprising an insulating base 32 upon which the wiring pattern has been placed in the form of deposited or applied metallic conductors 34. The particular component illustrated in FIG. 2 is a capacitor fabricated from a disc-like dielectric body 36 having conductive layers 38 deposited on opposing sides thereof. This capacitor is commonly referred to as a "leadless" type since electrical contact is made directly between the conductors 34 on the chassis and the capacitor plates or conductive layers 38.

The printed circuit board 30 is accurately positioned beneath the inserting head by an indelible conveyor 40. A conveyor adapted to operate in a production line having machines of the type illustrated in the drawings is shown and described in United States Patent No. 2,873,513, issued February 17, 1959, entitled "Automatic Assembly Apparatus" and assigned to the same assignee as the present invention.

Control means (not shown) for the insertion head is connected with the control means for the conveyor so that the insertion head will operate only during the dwell period of the conveyor. At this time, the aperture 28 is accurately positioned beneath the inserter head 24.

The oscillatable hopper 20, in which a plurality of components 22 are placed, is pivotally mounted on the frame 42. The apparatus frame 42 comprises a base member 52 to which is attached a vertical standard or post 54. Horizontal platform 56 is adjustably secured to the post 54 by a screw 58 which allows the vertical height of the insertion head above the chassis to be adjusted. Clearance is necessary, when the conveyor indexes, between the head in its retracted position and previously inserted components on the board 30.

The fluid motor 46 reciprocates the insertion head 24 and is mounted on a bracket 60 affixed to the platform 56. Bracket 62 is affixed to the free end of the fluid motor cylinder. The hopper 20 is pivotally mounted on this bracket 62 by a bolt 64 secured thereon by a nut 66. Sleeve 68 on the bolt spaces the hopper away from the bracket.

The hopper 20 is a generally rectangular container 70 which has a cylindrically shaped bottom. A center board 72 extends nearly the full length of the container and through one end wall. The bolt 64 on which the hopper pivot passes through the extended portion of the center board.

The center board tapers upwardly from the bottom of the hopper to the mouth of the chute 26 outside the container walls. The upper surface 74 of the center board has a recess 78 defined by rails 76 to provide means for guiding the capacitors from the bottom of the container to the entrance of the chute when the hopper is oscillated. Skimmer 80 pivotally mounted on a rod 82 above the rails 76 prevents the stacking of components as they slide beneath it since the recess 78 is formed with clearance for only one component in width and depth.

Figure 5:
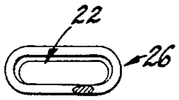
FIG. 5 is a cross section of the extensible component chute.

The chute 26 which conveys the capacitor 22 from the hopper to the inserting head is a spirally wound spring which has a substantially rectangular cross section (see FIG. 5). The inner configuration of the chute closely approximates the shape of the component 22 to prevent jamming of the capacitors in the chute. The flexibility and extensibility of the chute 26 allows the inserting head 24 to be angularly adjusted about its vertical axis, with respect to the longitudinal axis of the chassis, without requiring the location of the hopper to be changed and without distorting the chute beyond it useful point. This allows a plurality of machines to be placed side by side on the production line while the respective components inserted thereby need not be parallel.

Figure 6:
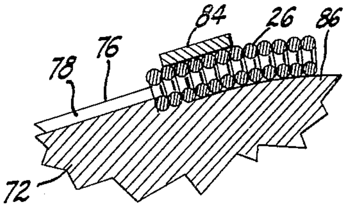
FIG. 6 is a fragmentary cross-sectional elevation of the hopper center board and the component chute showing the alignment thereof.
Figure 8:
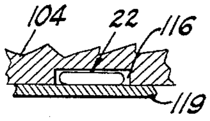
FIG. 8 is a fragmentary cross section taken along the line 8—8 of FIG. 7 showing the component raceway in the inserting head.

The chute 26 is secured to the center board 72 by a clamp 84 (see FIG. 6). A step 86 is provided in the center board 72 so that the interior of the chute may be aligned with the recess 78. The components may then easily slide from the recess to the interior of the chute without interference. The guide plates 88 and 90 are secured to the center board and restrain the chute from shifting off the center board during the oscillation of the hopper 20.

The oscillatory movements of the hopper are produced by the fluid motor 44 whose cylinder is pivoted at 92 on the bracket 60. The ram 94 of the fluid motor is pivotally secured to bracket 96 affixed to the bottom of the hopper. The advance or retraction of the ram 94 is controlled, through a suitable solenoid operated valve (not shown), by switches 98 and 100 which are mounted on the bracket 62. These switches are operated by a lever 102 affixed to the center board 72 of the hopper to change the direction of application of pressure to the fluid motor 44.

Figure 10:
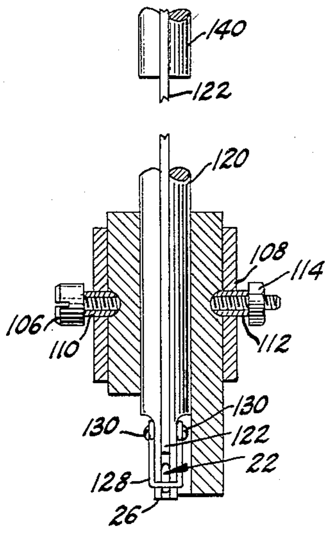
FIG. 10 is a fragmentary front cross-sectional view of the component inserting head in the loading position.

The inserter head 24 comprises a casing 104 which is adjustably retained in the platform 56 by a bolt 106. The casing is provided with a peripheral groove 108 into which are fitted a pair of tapered sleeves 110 and 112 (see FIG. 10) about the bolt 106 and retained thereon by a nut 114. When the nut and bolt are tightened the sleeves are advanced toward one another, their tapered surfaces engaging the groove 108 with sufficient friction to restrict the rotation of the casing in the platform. A portion of the casing 104 is formed with a component receiving raceway 116 (see FIGS. 1, 7, 8, 11 and 12) therein. Raceway 116 receives the components from the chute 26, whose interior is aligned therewith. The interior of the chute 26 is aligned with the raceway and is kept in position by a clamp 118. Transparent cover 119 retains the components in the raceway and allows visual inspection of the raceway and its contents in the event of insertion failure.

The reciprocating portions of the insertion head comprise component retaining means 120 and the component inserter 122. The retainer 120 is in the form of a cylindrical member or rod having a longitudinal groove 124 formed therein in which inserter 122 slides. The lower end of the rod is tapered to allow the insertion of components adjacent previously placed components. The end of the groove 124 forms a retaining pocket 126 which keeps the capacitor in position after it has been transferred to the retainer from the raceway and until it is inserted in the board. The capacitor is kept from dropping through the pocket 126 by a U-shaped spring 128 attached to the retainer by screws 130. The retainer is restrained from rotation during reciprocation of the head by a key 132 which rides in a groove 134 formed in the interior surface of the casing 104 (see FIGS. 7, 10 and 12). The upper end 136 of the retainer is threaded and has an adjustable knurled nut 138 thereon.

Figure 9:
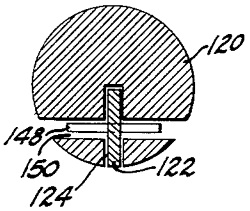
FIG. 9 is a cross section of the component inserter and body of the component retaining member taken along a line 9—9 of FIG. 7.

The inserter 122 is attached by one end to a block 140 secured by a nut 142 to the ram 144 of fluid motor 46. The lower end 146 of the inserter conforms to the configuration of the disc capacitor 22. A pin 148 affixed to the inserter 122 extends to the exterior of the retainer through a slot 150 (see FIG. 9). Spring 152 is positioned between the nut 138 and a washer 154 above the block 140. This spring extends the retainer with respect to the inserter until the retainer is arrested by the pin 148 contacting the nut 138.

A chassis support block 48 is advanced to a position beneath the printed circuit board 30 by the operation of the fluid motor 50 which is controlled by means on the conveyor (not shown) to add support to the chassis at point where the capacitor or other component is inserted.

The apparatus herein described aligns and dispenses one at a time a plurality of capacitors which have been placed in the component hopper 20. The hopper is oscillated by the action of a fluid motor 44 which is controlled by switches 98 and 100 mounted on the bracket 62. Referring to FIG. 1, the switches are operated by a lever 102 mounted on the hopper to cause the reversal of the directions of the hopper movement at the end of its path. The rate of oscillation of the hopper between its extreme positions is dependent on the fluid pressure applied to the motor 44 and is adjustable.

Starting with the hopper in the lower position, the movement of the hopper toward the upper position causes the capacitors to slide from the rear of the hopper toward the front as the hopper tilts. Some of the capacitors slide into the recess 78 in the center board 72. These capacitors slide beneath the skimmer 80 when the recess has been tilted to a sufficient angle with respect to the horizontal in its curvi-linear movement about the pivot 64. The skimmer 80 rests on the rails 76 formed on the top of the center board 72 during a portion of the upward movement of the hopper and allows only one capacitor at a time to pass between the skimmer and the bottom of the recess 78. Capacitors which become jammed beneath the skimmer will be freed on the next oscillation of the hopper since the skimmer pivots away from the center board during a portion of the cycle. Thus a gate is provided which is cleared cyclically.

After the capacitors within the recess have passed the skimmer they slide into the flexible chute 26 and drop through into the raceway 116 formed in the inserter head. The oscillation of the hopper and reciprocation of the insertion head cause the chute to be jiggled, thus preventing the components from becoming stuck in the chute. The aligned capacitors stack vertically in the raceway and chute in serial array prior to insertion.

When the retainer and inserter are in the retracted position, the first capacitor may drop into the pocket 126. The pocket allows only one capacitor at a time to be dispensed from the raceway. When a printed circuit board has been properly positioned beneath the inserting head, control means (not shown) energizes fluid motor 46 causing the ram 144 to advance the inserter 122 and retainer 120. At the same time the fluid motor 50 is energized placing support block 48 into position beneath the board 30. Since the support block has a shorter distance to travel it will arrive beneath the workpiece prior to the contact of the insertion head. The retainer continues to descend until it lightly contacts the printed circuit board. Further descent is prevented by the knurled nut 138 which contacts the casing 104. The retainer's position relative to the board may be adjusted by rotating the threaded nut about the retainer.

Continued movement of the ram 144 causes the inserter 122 to move relative to the arrested retainer 120. The contoured end 146 of the inserter 122 contacts the capacitor 22 and forces it past the spring 128 into the aperture 28 in the chassis 30. Once the capacitor has been fully inserted, the control means (not shown) on the conveyor causes the ram 144 to retract and also causes the support block to be retracted. During the retraction of the inserter 122 the pin 148 contacts the knurled nut 138 and lifts the retainer into its loading position. When the inserter has been fully retracted the next capacitor in the raceway drops into the pocket 126 and the apparatus is then ready for the next insertion cycle which will occur after the conveyor has been indexed.

In a production line installation of apparatus of this nature, the oscillation rate of the hopper has been found to be considerably slower than the number of capacitors inserted per minute. This is possible because a plurality of capacitors are fed into the chute with each oscillation of the hopper. Actual experience has shown that the rate of oscillation of the hopper may be approximately 10 cycles per minute while the rate of capacitor insertion is 30 capacitors per minute.

Although several embodiments of the invention have been shown and described, it will be apparent to those skilled in the art that various changes and modification may be made therein without departing from the scope of the invention as defined by the appended claims.

What is claimed is:

1. In an apparatus for inserting components of the leadless type into an apertured electrical chassis having a longitudinal axis the combination of an oscillatable hopper for said components, means for oscillating said hopper in a vertical plane about a fixed horizontal axis, a reciprocably mounted component inserting head having a vertical axis parallel to said plane, means for adjusting the angular position of said head about said vertical axis relative to the vertical plane of said hopper, flexible means secured at one end to said hopper and at the other end to said inserting head for conveying said components from said hopper to said inserting head, means for operating said inserting head whereby said component is inserted in an aperture in said chassis at an angle to the longitudinal axis of said chassis and to the plane of said hopper.

2. In an apparatus for inserting components of the leadles; type into an apertured electrical chassis having a longitudinal axis the combination of an oscillatable hopper for said components, means for oscillating said hopper in a vertical plane about a fixed horizontal axis parallel to the longitudinal axis of said chassis, a reciprocably mounted component inserting head having a vertical axis parallel to said plane, means for adjusting the angular position of said head about said vertical axis relative to the plane of said hopper, flexible means secured at one end to said hopper and at the other end to said inserting head for conveying said components from said hopper to said inserting head, means for operating said inserting head whereby said component is inserted in an aperture in said chassis at an angle to the longitudinal axis of said chassis and to the plane of said hopper.

3. In an apparatus for inserting substantially flat components of the leadless type into an apertured electrical chassis the combination of an oscillatable hopper for said components; means for oscillating said hopper in a curvilinear path in a vertical plane about a fixed horizontal axis; a component inserting head having a vertical axis comprising a fixed casing angularly adjustable about said vertical axis relative to the plane of said hopper and having a component receiving raceway therein, a reciprocably mounted component inserter, component retaining means mounted about said inserter for receiving a component from said raceway and delivering said component to said inserter flexible means secured at one end to said hopper and at the other end to said raceway for conveying said components from said hopper to said raceway; and means for reciprocating said inserter whereby said component is inserted in an aperture in said chassis at an angle relative to the plane of said hopper.

4. In an apparatus for inserting leadless components into an apertured electrical chassis the combination of a frame, a hopper for said components pivotally mounted on said frame, means for cyclically moving said hopper in a curvilinear path in a vertical plane about a fixed horizontal axis, means mounted on said frame for detecting the direction of movement of said hopper and responding thereto to cause the direction of movement of said hopper to reverse, an inserting head angularly adjustable about its vertical axis which is parallel to the plane of said hopper, flexible means secured at one end to said hopper and at the other end to said inserting head for conveying a plurality of said components from said hopper to said inserting head in serial array, and means for operating said inserting head whereby said components are inserted one by one in said apertures in said chassis at an angle to the plane of said hopper.

5. In an apparatus for inserting substantially flat leadless components having conductive surfaces arrayed on opposing sides of a dielectric member into an apertured electrical chassis the combination of an oscillatable hopper for said components, a tapered vertical center board mounted in said hopper and having a component receiving recess formed in the surface thereof, means for oscillating said hopper in a curvilinear path in a vertical plane about a fixed horizontal axis, a component skimmer pivotally mounted in said hopper in cooperative relationship with said recess in said centerboard for restricting the flow of components therethrough in one position of said hopper, a component inserting head having a vertical axis parallel to said plane, means for adjusting the angular position of said head about said vertical axis, means for conveying said component from said hopper to said inserting head comprising a spirally wound substantially rectangular extensible member affixed at one end of said center board of said hopper with said recess in said center board aligned with an opening in one end of said extensible member the other end of said extensible member being secured to said inserting head, and means for operating said inserting head whereby said component is inserted in an aperture in said chassis at an angle to the plane of said hopper.

References Cited in the file of this patent

UNITED STATES PATENTS

| | | |
|---|---|---|
| 1,412,227 | Anderson | Apr. 11, 1922 |
| 2,235,084 | Ortegren | Mar. 18, 1941 |
| 2,255,625 | Ortegren | Sept. 9, 1941 |
| 2,310,638 | Hubbard | Feb. 9, 1943 |